(12) United States Patent
Wampler, II

(10) Patent No.: US 10,928,457 B2
(45) Date of Patent: Feb. 23, 2021

(54) BATTERY STATE ESTIMATION USING HIGH-FREQUENCY EMPIRICAL MODEL WITH RESOLVED TIME CONSTANT

(71) Applicant: GM Global Technology Operations LLC, Detroit, MI (US)

(72) Inventor: Charles W. Wampler, II, Birmingham, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 230 days.

(21) Appl. No.: 16/213,147

(22) Filed: Dec. 7, 2018

(65) Prior Publication Data

US 2020/0182937 A1    Jun. 11, 2020

(51) Int. Cl.
| | | |
|---|---|---|
| *G01R 31/367* | (2019.01) | |
| *G01R 31/371* | (2019.01) | |
| *G01R 31/3842* | (2019.01) | |
| *H02J 7/00* | (2006.01) | |
| *H02J 7/14* | (2006.01) | |

(Continued)

(52) U.S. Cl.
CPC .......... *G01R 31/367* (2019.01); *B60L 53/00* (2019.02); *B60L 58/12* (2019.02); *G01R 31/371* (2019.01); *G01R 31/3842* (2019.01); *H02J 7/0047* (2013.01); *H02J 7/0068* (2013.01); *H02J 7/14* (2013.01); *B60K 6/28* (2013.01); *B60L 2240/545* (2013.01); *B60L 2240/547* (2013.01);

(Continued)

(58) Field of Classification Search
CPC ................ G01R 31/367; G01R 31/371; G01R 31/3842; G01R 31/388; B60L 58/12; B60L 53/00; B60L 2240/545; B60L 2240/547; H02J 7/0047; H02J 7/0068; H02J 7/14; H02J 7/005; H02J 7/0048; H02J 2310/48; B60Y 2300/91; B60Y 2200/91; B60Y 2200/92; B60K 6/28; Y02T 90/14; Y02T 10/7072; Y02T 10/70
See application file for complete search history.

(56) References Cited

U.S. PATENT DOCUMENTS

| | | | |
|---|---|---|---|
| 7,324,902 B2 * | 1/2008 | Verbrugge ........... | G01R 31/367 702/64 |
| 7,373,264 B2 | 5/2008 | Verbrugge et al. | |

(Continued)

*Primary Examiner* — Jared Fureman
*Assistant Examiner* — Michael J Warmflash
(74) *Attorney, Agent, or Firm* — Quinn IP Law

(57) ABSTRACT

An electrical system includes a battery, sensors, and a controller. The sensors output measured signals indicative of an actual state of the battery, including respective actual voltage, current, and temperature signals for each battery cell. The controller, in conducting a method, generates an estimated state of the battery, including a predicted voltage of the battery, doing so responsive to the signals using an open-circuit voltage and an output of an empirical model. An operating state of the electrical system is controlled using the estimated state. The empirical model includes low-pass/band-pass filters and a high-pass filter each with a different time-constant, the time-constants being spread over a time-constant range. Each low-pass/band-pass filter branches through a basis function(s) whose output(s) are multiplied by a respective resistance value to generate higher-frequency voltage transients. The controller sums the open-circuit voltage and voltage transients to derive the predicted voltage.

20 Claims, 7 Drawing Sheets

(51) Int. Cl.
  *B60L 53/00*   (2019.01)
  *B60L 58/12*   (2019.01)
  *B60K 6/28*    (2007.10)

(52) U.S. Cl.
  CPC ....... *B60Y 2200/91* (2013.01); *B60Y 2200/92* (2013.01); *B60Y 2300/91* (2013.01)

(56)           References Cited

U.S. PATENT DOCUMENTS

| | | | |
|---|---|---|---|
| 8,321,164 B2 * | 11/2012 | Liu | B60L 58/12 |
| | | | 702/63 |
| 9,377,512 B2 | 6/2016 | Frost et al. | |
| 2015/0219726 A1 | 8/2015 | Lenz et al. | |
| 2019/0170830 A1 * | 6/2019 | Ohkanda | H01M 10/46 |
| 2020/0182937 A1 | 6/2020 | Wampler, II | |
| 2020/0185792 A1 * | 6/2020 | Wampler, II | B60L 58/12 |

\* cited by examiner

BATTERY STATE ESTIMATION USING HIGH-FREQUENCY EMPIRICAL MODEL WITH RESOLVED TIME CONSTANT

INTRODUCTION

The present disclosure relates to electrical systems employing rechargeable batteries. Aspects of the disclosure pertain to the real-time estimation of the battery's cell voltages, and the use of the same to estimate the battery's state of charge (SOC) or state of power (SOP). As commonly used in the art, the term "state of charge" is the battery energy, usually expressed as a percentage, that remains available for use in the battery's various cells relative to a respective SOC of a fully-charged battery. "State of power" describes the remaining power capability of the battery after a predefined duration of maximum use, e.g., 2 s or 10 s. Monitoring of the battery state enables optimal control and power flow decision making to occur during charging or discharging operations. Thus, electrified vehicles, powerplants, and other electrified systems benefit from use of a battery management system that is better able to track the evolving internal state or states of the battery between actual state measurements. The present disclosure lends itself to supporting such applications.

A battery cell includes positive and negative electrodes. In the present state of the art, such cells are often made of porous materials permeated with a liquid electrolyte. During charging of an example lithium-ion battery cell, for instance, lithium atoms diffuse to the surface of the positive electrode where an electrochemical reaction occurs. This electrochemical reaction produces positively-charged lithium ions, which then migrate through the electrolyte solution in the pores of the positive electrode, cross a separator that prevents direct contact between the positive and negative electrodes, and thereafter migrate into the pores of the negative electrode. The lithium ions eventually reach the negative electrode surface, whereupon the ions undergo a second electrochemical reaction. The lithium ions then diffuse into the negative electrode material.

The direction of the above-noted reactions and flow of lithium ions reverses during discharge of the battery cell. The above-noted example lithium species may be replaced by other application-suitable chemical species, and for some battery constructions only one of the two electrodes may be porous.

The nature of the physicochemical processes governing the flow of chemical species is such that the concentration of each species is not necessarily uniform through a given electrode. Such non-uniformity results in differences in the local SOC at various points in the electrode material. In particular, the local SOC in the front of the electrode, that is, nearest the separator region, may differ from the local SOC in the back of the same electrode, that is, nearest the current collector, giving thereby a front-to-back SOC disparity. Similarly, the local SOC can be non-uniform inside a solid particle of a given electrode. In particular, the local SOC at the surface of a particle may differ from the local SOC nearer the center of that particle, giving surface-to-core SOC disparity. Furthermore, the concentration of ions in the electrolyte may have gradients.

A battery cell resting at open circuit, given sufficient time, will settle to an equilibrium voltage referred to as the cell's open-circuit voltage (OCV). Ideally, the OCV of a given battery cell is unique for each SOC, independent of whether the battery cell was charging or discharging just before switching to an open-circuit condition, and also independent of the magnitude of the battery current. OCV increases monotonically as the cell's SOC increases, and thus the relationship between OCV and SOC is invertible. That is, with x being a fractional SOC, i.e., $0 \le x \le 1$, and $V_o$ representing the OCV, a non-linear OCV curve is defined by the function $V_o = U(x)$, which is invertible as $x = U^{-1}(V_o)$. Accordingly, once a given battery cell has rested long enough and its OCV is accurately measured, the SOC may be estimated. A key challenge in battery state estimation is to provide an estimate of SOC in real time, that is, even while the battery is in use or when it has been recently used. In such situations, the battery is not at rest and local SOC disparities are present.

The state vector of a dynamical system is a list of state values that gives all the information needed to predict how the system will evolve in time in response to known inputs. By this definition, the bulk SOC of a battery is one state value in the battery's state vector, but it is not the entire state vector, because it does not suffice by itself to predict transient effects. A mathematical model that approximates the time response of a battery also has a state vector, one entry of which might be the bulk SOC. If the model of a battery is of a physicochemical type, its state vector might describe the distribution of local SOC throughout the battery. Alternatively, the model may be in the form of an empirical equivalent circuit that does not directly account for local SOCs but nevertheless suffices for predicting the voltage transients at the terminals of the battery. In that case, the state vector might include the voltages across a number of capacitor model elements in an electrical network. In the present disclosure, the battery state refers to the entire state vector of the mathematical model that approximates the battery's response. The battery SOC, sometimes referred to here as the bulk SOC in order to distinguish it from the disparate local SOC values, is either one entry in the state vector or is otherwise derivable from the values in the state vector.

In hybrid electric or battery electric vehicles, battery state estimator (BSE) logic may reference such an OCV curve to estimate SOC in real-time. Alternatively, SOC may be tracked from an initial SOC x(0) at t=0 using a procedure referred to as Coulomb counting, i.e., $$x(t) = x(0) + \frac{1}{Cap} \int_0^t I(\tau) d\tau,$$

where Cap is the capacity of the battery cell and $I(\tau)$ is the battery current. BSE logic may balance voltage-based estimates and Coulomb-based estimates to produce a composite estimate. Since Coulomb counting is inherently open-loop and subject to accumulation of integration error, a voltage-based estimate serves as an important closed-loop check. Accuracy of determination of the above-noted OCV curve and real-time state estimation problem are complicated by the presence of circuit resistance and voltage transients, as well as charge transfer physics occurring within the battery cell itself, all of which may combine to render existing SOC/SOP estimation techniques less than optimal under certain conditions.

SUMMARY

An improved battery state estimation (BSE) method is disclosed herein for use with an electrical system having a single-cell or multi-cell battery as part of the electrical system's configuration. While a lithium-ion chemistry is described as an example battery chemistry species, the teachings are not limited to lithium-ion batteries. As part of the disclosed approach, a controller is programmed to execute instructions embodying the present method and thereby estimate the state vector of the various battery cells by applying a mathematical model to match sensor-based measurements. From such estimates, the controller derives a state of charge (SOC) and possibly a state of power (SOP) of the battery, which in turn may be used to inform power-flow control decisions.

Graphite is widely used as the active material in negative electrodes of lithium-ion batteries. The present method is of particular applicability to such a material, as the OCV curve of a graphite electrode has several almost flat regions, often referred to as plateaus, with relatively sharp transitions between the plateaus. Near these transitions, a small difference in local SOC of the electrode, such as a front-to-back SOC disparity, may have a significant, albeit transient, effect on the terminal voltage. If the transient voltage effect is not properly taken into account, an accurate real-time battery state estimation may result. Thus, discrete/single-layer bulk estimations of the battery cell's SOC may result in less than optimally accurate real-time battery state estimations. The present method is intended to help improve such state estimations by carefully considering such transient effects.

Each electrode has a corresponding open-circuit voltage (OCV) curve, which can be experimentally measured relative to a common reference, typically pure lithium. The OCV observed at a cell's terminals is the difference between two half-cell OCVs of the cell. A difference in the local SOC, such as a front-to-back or surface-to-core SOC disparity, can result in different OCVs at different points in the electrode. The voltage measured at the battery's terminals is influenced by these local voltages. If the battery cell is allowed to rest at open circuit, lithium (in a lithium-ion embodiment) will move from regions of high concentration towards regions of low concentration, both by diffusion within the solid materials of the electrode and by the aforementioned processes whereby lithium de-intercalates from regions of higher local SOC, migrates through the electrolyte in the pores, and intercalates into regions of lower local SOC. This results in transients in the voltage measured at the terminals. As the local SOC throughout the electrode equilibrates to a uniform bulk SOC, the terminal voltage settles to the cell OCV. Accordingly, to more accurately estimate the bulk SOC in real-time given measurements of the terminal voltage, it is desirable to compensate the measured voltage to remove the transient effects. The present method has the benefit of removing such effects.

An electrical system according to an example embodiment includes a battery having one or more battery cells, sensors, and a controller. The battery may have a lithium-ion or other suitable battery chemistry. The sensors output measured signals indicative of actual parameters of the battery back, including actual voltage, current, and temperature values of each battery cell. The controller, in response to the measured signals, estimates the full state vector of the battery using an open-circuit voltage (OCV) and an empirical model of higher-frequency voltage transients, and thereafter controls an operating state of the electrical system in real-time responsive to the estimated state, including a predicted voltage of the battery. For instance, the operating state may be a charging or discharging operation of the battery.

The empirical model includes low-pass and/or band-pass filters and a high-pass filter each with a different time-constant collectively spread over a predetermined time-constant range, with three or more low-pass and/or band-pass filters used in an optional embodiment. The current sensor signal is the input of each filter. The output of each filter branches through one or more basis functions whose respective outputs are then multiplied by a respective calibrated resistance value to generate the above-noted higher-frequency voltage transients. At least one basis function may be a non-linear basis function. The controller sums the voltage transients with the estimated OCV to derive a predicted voltage as part of the estimated state. At a given time instant, the state of the empirical model is an array of numbers containing the set of filter outputs and the OCV. The state may also include the list of resistance values.

The controller may periodically adjust the state of the empirical model based on a difference between the predicted and actual voltages. Also, the controller may derive a state of charge (SOC) of the battery using the estimated state, and also may adjust the empirical model in real-time for improved model accuracy, e.g., by periodically adjusting the respective calibrated resistances based on the SOC and/or the temperature.

The electrical system may be in communication with a display device, with controller in such an embodiment configured to display the SOC and/or other state of the battery via the display device.

Additionally, the controller in some embodiments may generate the predicted voltage using an optional low-frequency porous electrode transient (PET) model in addition to the above-noted empirical model. Such a low-frequency PET model accounts for the above-noted uneven SOC distribution between and through the depth of the electrodes of each of the battery cells.

The controller may optionally derive a numeric state of health of the battery using a time history of the estimated state, and output a signal indicative of the numeric state of health. For example, sustained increases in the adjusted resistances may indicate a decline in the state of health of the battery.

An electric machine may be coupled to a load in a non-limiting application of the above-noted electrical system, such that the electric machine powers the load in a discharging mode and draws power from the load in a charging mode/regeneration state. The load may be a set of drive wheels of a motor vehicle. Furthermore, in such an exemplary application, such as when the vehicle is descending a grade or when it is desired to lower the speed of the vehicle, the electric machine may be used as a generator to convert mechanical energy into electrical energy that can be stored in the battery via the electrical system. Thus, for a typical driving scenario the battery will experience periods of discharging and periods of charging, with these periods possibly having various durations and intensities.

In another non-limiting application, the electrical system may be used as part of a hybrid-electric vehicle in which power may flow between the electrical system and one or more electric machines, but also between the electrical system and an auxiliary power source, such as a motor-generator set or a fuel cell.

In an electric vehicle or a plug-in hybrid-electric vehicle, the electrical system may be periodically connected to a charging station or other external source of electrical power. In non-vehicle applications, the battery is also periodically recharged. Such recharge periods may end before the battery reaches a full SOC.

A method for use with the electrical system is also disclosed, with the method in an example embodiment including measuring quantities or parameters dependent upon the actual state of the battery, these quantities including respective actual voltage, current, and temperature values of each of individual battery cells or of the battery as a whole. The method further includes, responsive to the signals, generating an estimated state of the battery, including a predicted total voltage, via a controller using at least an open-circuit voltage and an empirical model.

As part of the disclosed approach, the method includes feeding a measured current signal through a plurality of low-pass and/or band-pass filters and a high-pass filter each having a different time-constant collectively spread over a predetermined time-constant range, with each low-pass/band-pass filter branching through one or more basis functions, and then multiplying the output of each low-pass/band-pass filter and the high-pass filter by a respective calibrated resistance value to generate a set of higher-frequency voltage transients. Further, the method includes summing the plurality of higher-frequency voltage transients and the open-circuit voltage to derive the predicted total voltage. An operating state of the electrical system may be controlled in real-time via the controller responsive to the predicted total voltage.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

Figure 1:
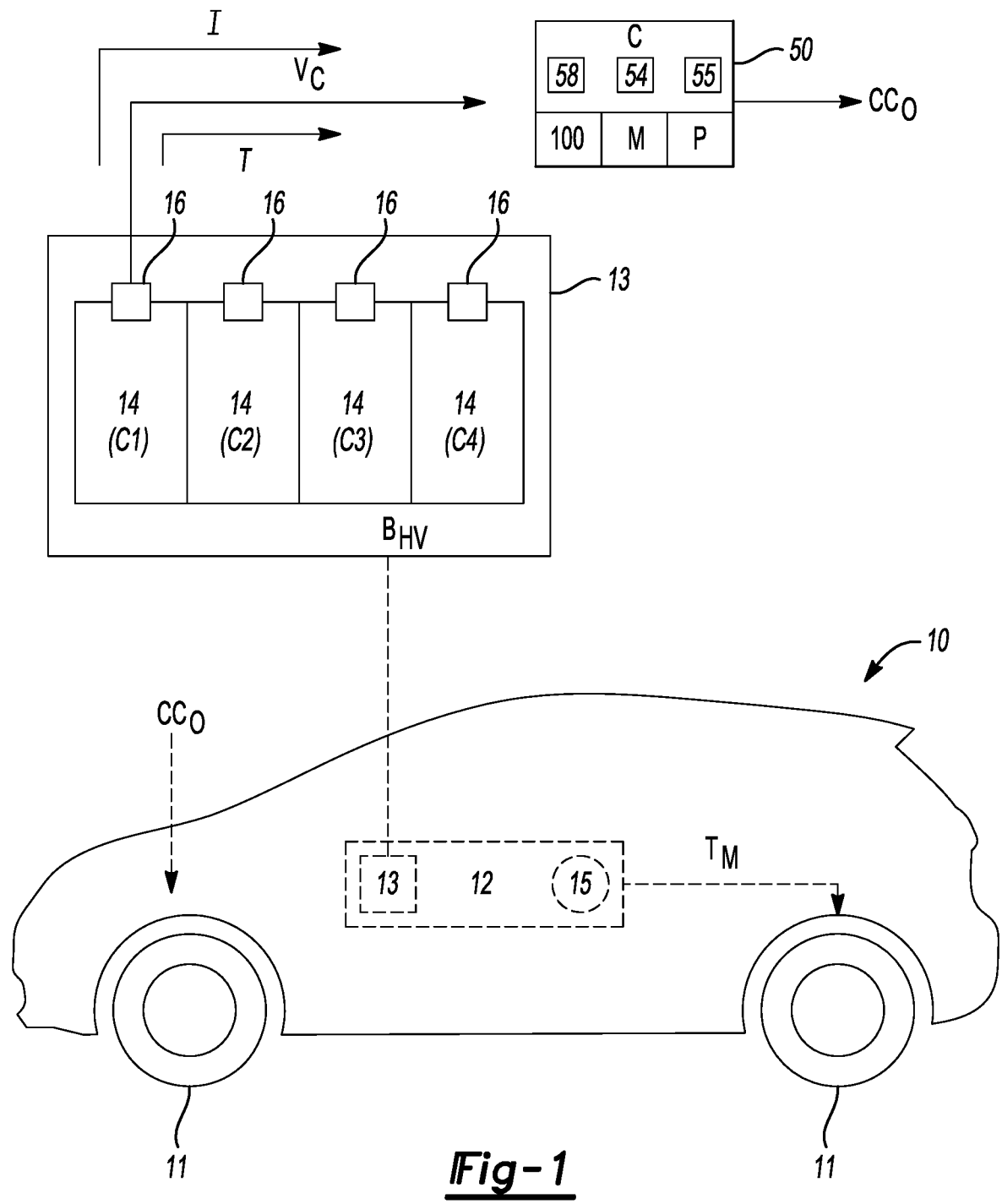
FIG. 1 is a schematic illustration of an example vehicle having an electrical system that includes a battery and a battery controller configured to estimate a state of the battery, e.g., state of charge (SOC), using an empirical model, with the empirical model employing a bank of filters and basis functions, and with the filters having a range of time constants to account for transient voltage behavior of one or more battery cells of the battery.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

Referring to the drawings, wherein like reference numbers refer to like components, FIG. 1 depicts an example vehicle 10 having a set of drive wheels 11 powered via motor torque using an electrical system 12, or helping generate power in a regenerative mode. Power flow to or from the electrical system 12 is managed in real-time by a controller (C) 50, e.g., a battery system manager or other control device(s), with the controller 50 regulating operation of the electrical system 12 via a set of output control signals (arrow $CC_O$). The vehicle 10 may be optionally embodied as a hybrid electric vehicle or a battery electric vehicle in which the electrical system 12 ultimately generates and delivers propulsion torque to the drive wheels 11, such as motor torque (arrow $T_M$) delivered from an electric machine 15 when acting as a traction motor as part of the electrical system 12, or draws power from the drive wheels 11 using the electric machine 15 as a generator. While the vehicle 10 is referred to hereinafter as an example of a type of high-energy system that may benefit from the present teachings, vehicles other than the illustrated motor vehicle 10, e.g., aircraft, marine vessels, or rail vehicles, as well as stationary or mobile powerplants, platforms, robots, etc., without limitation.

Figure 2:
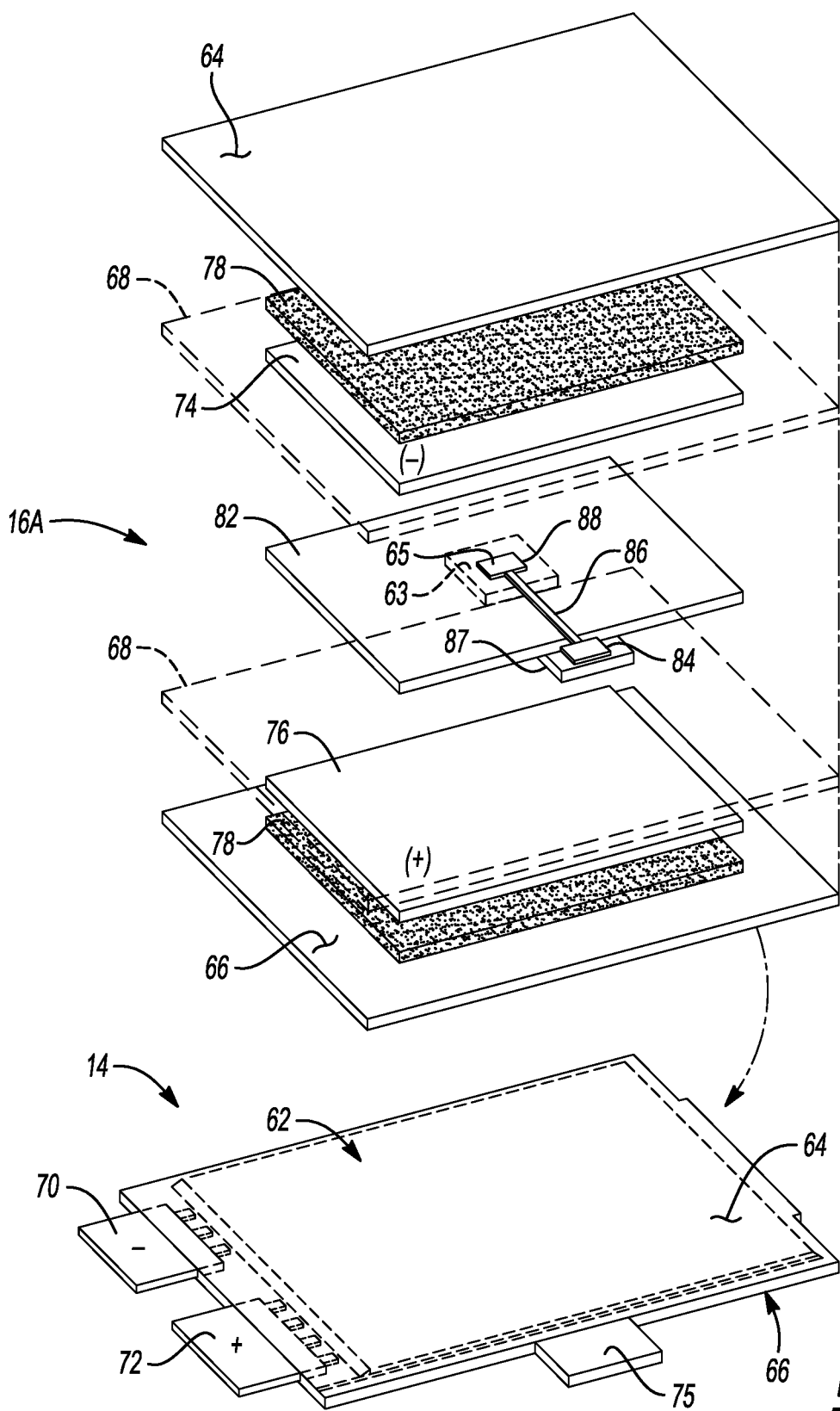
FIG. 2 is a schematic illustration of an example battery cell whose state may be estimated in real time according to the present strategy.

The electrical system 12 includes a high-voltage battery ($B_{HV}$) 13 having one or more constituent battery cells 14. Four such battery cells 14 are individually labeled C1, C2, C3, and C4 in FIG. 1 for clarity. The number of battery cells 14 is application-specific, and may include as few as one battery cell 14 or modules having 96 or more such battery cells 14 connected in series and three or more such modules connected in parallel, with the actual configuration depending on the energy requirement of the particular system or systems powered by the battery 13. A possible exemplary construction of a given one of the battery cells 14 is depicted in FIG. 2, with a non-limiting example chemistry of the battery cells being lithium-ion. Although shown schematically for illustrative simplicity and clarity, the electric machine 15 may be coupled to the road wheels 11 directly or via intervening gear arrangements and drive axles, with a power inverter module used to invert a DC voltage from the battery 13 into a polyphase voltage suitable for energizing windings of the electric machine(s) 15.

According to the present strategy, the controller 50 employs real-time battery state estimation (BSE) techniques using a plurality of sensors 16 to measure signals indicative of parameters or values in the form of a cell voltage (arrow $V_C$), current (arrow I), and temperature (arrow T) of the battery cell(s) 14. The cell voltage (arrow $V_C$) may be estimated or modeled in some embodiments. The signals are collectively indicative of an actual state of the battery 13, and may be determined within each battery cell 14 as shown in FIG. 2, or the values may be measured collectively at the level of the battery 13 and back-calculated or estimated from such levels. The controller 50 may be embodied as part of a battery management system or as a separate device, and includes more low-voltage digital computers including a processor (P), e.g., a microprocessor or central processing unit, as well as memory (M) in the form of read only memory, random access memory, electrically-programmable read only memory, etc., a high-speed clock, analog-to-digital and digital-to-analog circuitry, input/output circuitry and devices, and appropriate signal conditioning and buffering circuitry. The controller 50 may have, as part of its designated control functionality, the tasks of monitoring and controlling temperature, state of charge, voltage, and other performance characteristics of the battery 13.

As part of a computer-executable method 100 for estimating the state of the battery 13, the controller 50 may receive the individual currents ($I_C$) from the sensors 16, with the voltages ($V_C$) likewise measured or modeled. In executing the method 100, the controller 50 automatically derives the battery's present state, including a predicted total voltage and, from there, a bulk state of charge (SOC) and a state of power (SOP) of the battery 13 as those terms are described above. The controller 50 does so with the assistance of an empirical model 55 capturing higher-frequency transient voltage effects occurring within the battery cell(s) 14, which can be added or subtracted from the open-circuit voltage of the battery cell(s) 14. SOC estimation may be adapted in real-time, e.g., using a Kalman filter or variant as set forth below, to improve the accuracy of the empirical model 55 and the estimated voltages.

In particular, the controller 50 is configured, using the empirical model 55, to estimate the cell voltage, SOC, and SOP of the various battery cells 14 with a high level of accuracy relative to bulk or discrete approaches such as RC-pair modeling. As will be described in detail below with particular reference to FIG. 6, the empirical model 55 is used to model higher-frequency transient behavior and effects, and passes the actual state signals from the sensors 16 through a bank of low-pass and high-pass filters having respective time-constants collectively spread over a pre-defined range of interest. At least some of the low-pass filters may be embodied as band-pass filters within the scope of the disclosure.

Figure 3:
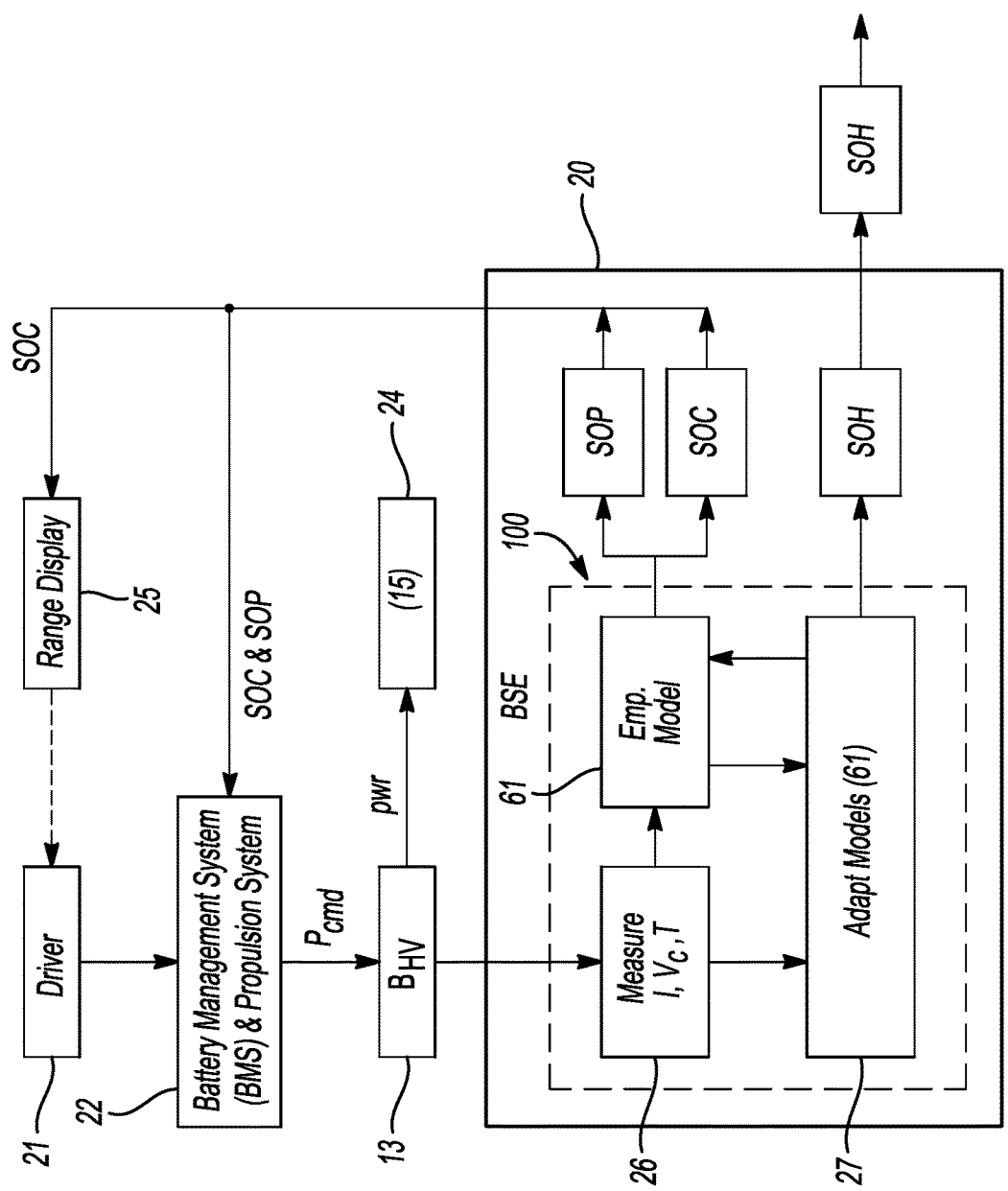
FIG. 3 is a schematic logic flow diagram of the battery and controller of FIG. 1.
Figure 4:
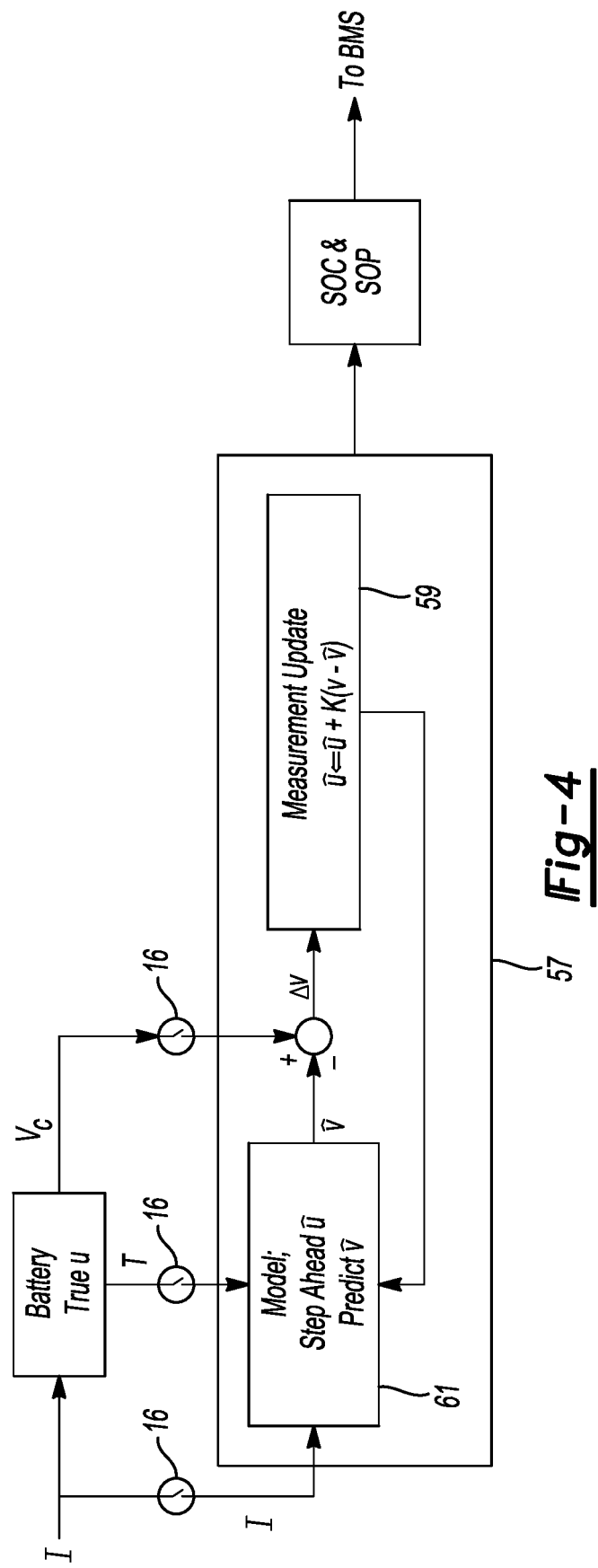
FIG. 4 is a schematic control diagram for estimating SOC and state of power (SOP) of the battery of FIG. 1 using the present method.

The empirical model 55 then resolves the contribution of each time-constant using a combination of linear and possibly non-linear basis functions. Optionally as described below with reference to FIG. 5, the results may be further improved using a porous electrode transient (PET) model 58 as a physicochemical model of low-frequency transient behavior within the battery cell 14. The collective model set may be updated in real-time, e.g., as shown in FIGS. 3 and 4, with the predicted total voltage and/or other battery states thereafter used in the overall control of charging/discharging operations the battery 13.

As shown in the non-limiting example configuration of FIG. 2, each battery cell 14 may be embodied as a multi-layer construction having an envelope-like pouch 62 with generally flat, rectangular major facing sides 64 and 66. The sides 64 and 66 may be formed of aluminum foil or other suitable material and coated with a polymeric insulating material. The sides 64 and 66 are connected, e.g., via welding or crimping, to enclose an electrolyte solution (shown schematically at 68) that conducts positive lithium ions. Negative (−) and positive (+) tabs 70 and 72 shown at the bottom of FIG. 2 extend from longitudinal edges of the sides 64 and 66, respectively, for making electrical connections with respective negative (−) and positive (+) electrodes, i.e., an anode 74 and cathode 76, within an internal volume of the pouch 62.

A series of porous separator sheets 78 are interleaved between the anode 74 and cathode 76 in this exemplary configuration. The anode 74 and cathode 76 are operatively attached to the pouch 62 and placed in electrochemical contact with the electrolyte solution 68 such that ions are transferable therebetween during charging or discharging of the battery cell 14. In a lithium-ion embodiment, the cathode 76 may be fabricated from material that is capable of supplying lithium ions during a battery charging operation and incorporating lithium ions during a battery discharging operation. The cathode 76 may include, for instance, a lithium metal oxide, phosphate, or silicate. Separator sheets 78 may be constructed of a porous polyolefin membrane, e.g., with a porosity of about 35% to 65%, and a thickness of approximately 25-30 microns. The separator sheets 78 may be modified by the addition of a coating of electrically non-conductive ceramic particles (e.g., silica).

A reference electrode assembly 16A may be used, but it not necessary. Instead, the method 100 may rely on modeling of the terminal voltage across both half-cells. When the reference electrode assembly 16A is available, sensing within the scope of the method 100, the reference electrode assembly 16A may be interposed between the anode 74 and cathode 76, and placed in electrochemical contact with the electrolyte solution 68. The reference electrode assembly 16A may function as a third electrode that independently measures a voltage of the anode 74 and cathode 76, and thus the battery cell 14. The reference electrode assembly 16A may be fabricated with a separator sheet 82 that supports an electrical contact 84, an electrical track 86, and an electrical lead 88. The dedicated separator sheet 82 may be fabricated from an electrically-insulating, porous polymeric material, such as polyethylene and/or polypropylene. Separator sheet 82 may be interposed in a face-to-face/non-contacting relationship between parallel faces of the anode and cathode 74 and 76, with the lithium ion-containing electrolyte solution 68 permeating and filling the pores and contacting the surfaces of the sheet 82. An optional jacket separator (not shown) may be disposed across and cover one or both sides of the separator sheet 82, e.g., to help ensure no direct physical contact with the anode and cathode 74 and 76.

In the illustrated example of FIG. 2, a support tab 87 may optionally project transversely from a lateral edge of the elongated separator sheet 82, with the electrical contact 84 deposited on or otherwise affixed to the support tab 87. The electrical track 86 electrically connects the electrical lead 88 to the electrical contact 84. The reference electrode assembly 16A may be fabricated with an intercalation electrode 65 that is deposited on the support sheet 82 and attached to the electrical lead 88. In the illustrated assembly configuration, electrically non-conductive particles may be deposited to create a very thin alumina layer 63 that is deposited on and covers the intercalation electrode 65 and, consequently, the electrical track 86. This alumina layer 63, which may be on the order of a few atoms thick, helps to stabilize the reference electrode assembly 16A, e.g., for a longer life.

As noted above, regardless of the actual configuration of the battery cells 14, two techniques for roughly estimating SOC of a battery cell 14 include Coulomb counting (i.e., integrating current) and a voltage-based lookup. For Coulomb counting:

$$SOC = SOC(t_0) + \frac{1}{Cap} \int_{t_0}^{t_1} I(t)dt$$

where $SOC(t_0)$ is an initial state of charge value (typically SOC=100% after a full charge). Errors in measuring the battery current, I(t), may lead to an accumulation of error in the estimated SOC, i.e., error may accumulate over longer elapsed time periods since a last full charge, and with the larger the number of partial charge events. Uncertainty in battery capacity may lead to error as the capacity degrades over the life of a battery. Estimating the SOC using a voltage lookup technique may rely on the fact that, when the battery 13 is fully rested, the equilibrium voltage/OCV uniquely indicates the SOC. In addition to or in lieu of such approaches, the present method 100 may be used to improve accuracy of BSE methods by applying the high-frequency empirical model 55, and optionally by treating variations in charge distribution through the depth of the anode 74 or cathode 76 via the optional PET model 58, as will now be set forth in detail with reference to the remaining Figures.

Before turning to a description of the internal operation of the empirical model 55, a schematic flow diagram of components and control blocks used in the overall BSE process is described with particular reference to FIG. 3. As will be appreciated, knowledge of cell voltage, SOC, SOP, and other related states are required for managing battery functions. For example, improved BSE accuracy enables operation to occur much closer to established battery limits, and thus possibly enable the completion of charge events near the top of an SOC range. The ability to operate at a lower SOC for improving the electric range of the electrical system 12 of FIG. 1 is also possible, with an improved tradeoff between the life and performance of the battery 13.

To provide these and other possible benefits, a BSE logic block 20 may be programmed in logic of the controller 50 shown in FIG. 1 or another computer device in communication with controller 50. Control inputs are fed into the BSE logic block 20 from the battery 13, including the periodically-measured (actual) cell voltage (arrow $V_C$ of FIG. 1) as noted above. In a vehicle embodiment, the driver 21 of the vehicle 10 may impart driver requests that are processed by the controller 50, e.g., via a battery management system (BMS) and propulsion logic block 22, with requests as acceleration, steering, and braking requests. In response, the controller 50 outputs a power command (arrow $P_{cmd}$) to the electrical system 12/battery 13 of FIG. 1 that either charges or discharges the battery 13 depending on an operating mode corresponding to the request. In the illustrated example, for instance, the battery 13 delivers electrical power to a drivetrain 24 of the vehicle 10, such as the electric machine 15 of FIG. 1 when coupled to the drive wheels 11 or another driven load.

At the same time, the BSE logic block 20 predicts the total voltage of the battery 13 and its SOC according to the present method 100 as detailed below with reference to FIGS. 4-7B. The estimated state values may be used to make various control decisions, including those based on a state of health (SOH) of the battery 13, SOP, a remaining electric range, etc. An optional display device 25 located within the vehicle 10 may use the estimated state(s) from the BSE logic block 20 to inform the driver 21 of a remaining charge or electric range, akin to how a fuel gauge is employed to indicate an amount of fuel remaining in a fuel tank. SOC and SOP are then fed back into the controller 50 and used for various control actions, such as to select powertrain operating modes, record diagnostic codes, etc.

Further with respect to the BSE logic block 20 of FIG. 3, various processes and routines may be performed to estimate the voltage between measurements, as well as to estimate SOC and SOP in real-time. For instance, a measurement block 26 with associated hardware measures the current (I), cell voltage ($V_C$), and temperature (T) of the battery 13/battery cells 14 at one or more locations. The empirical model 55 (and possibly the optional porous electrode model 58 of FIGS. 5 and 8) is then used to model high-frequency transient voltage effects of the battery cell(s) 14 and battery 13.

The modeled behavior may be used to derive a transient SOP and steady-state SOC, which as noted above are fed back to the controller 50 and possibly displayed to the driver 21 via the range display 25. An adaptation block 27, e.g., a Kalman filter, may adapt the existing high-frequency empirical model 55 and/or the porous electrode model 58 to more closely match the actual observed behavior of the battery 13, with the long-term SOH of the battery 13 possibly generated as another output, e.g., a value between "0" for a depleted battery 13 to "1" for a calibrated/new variant.

FIG. 4 depicts, at a high-level schematic level, certain functionality of the BSE logic block 20 of FIG. 3 using an optional Kalman filter block 57. For a specific battery current (I), the battery 13 has a true state u, and the controller 50 may use the sensors 16 to determine the cell voltage ($V_C$) and temperature (T) of the battery 13. The BSE does not know the exact true state u. Instead, the BSE keeps an internal estimate û of the state. Starting with the present estimate û, the models 55 and 58 may be used to estimate a "step-ahead" state vector û, with the term "step-ahead" meaning a new state a single time step ahead of the present state. A predicted voltage v̂ is calculated from the step-ahead estimate vector û. The predicted voltage v̂ may be subtracted from the measured voltage ($V_C$), and the difference ($\Delta V$) used as a feedback term to correct the models 55 and 58.

The Kalman filter methodology or a variant thereof may use a gain matrix K, with K being dependent on the state vector û and its covariance, as well as on measurement uncertainty. The state vector û may include local states of charge, RC-pair voltages, and circuit parameters. Thus, the Kalman filter block 57 is configured to update the full state vector û, i.e.,: û⇐û+K (v−v̂) via a measurement update block 59. The estimated SOC and SOP may thereafter be output to the controller 50, or battery management system (BMS) components thereof, for further control actions with respect to the electrical system 12 shown in FIG. 1.

Figure 5:
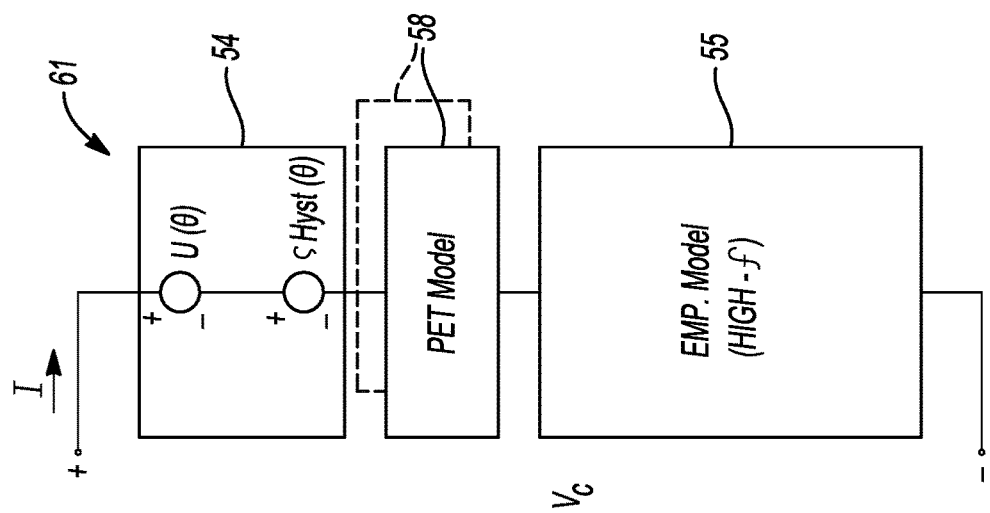
FIG. 5 is a schematic circuit diagram of an equivalent circuit usable as part of the present method.

FIG. 5 depicts a circuit model of cell voltage ($V_C$) that illustrates operation and placement of the empirical model 55 and the optional low-frequency porous electrode model 58. In an open-circuit state, the open-circuit voltage has a non-linear curve relating the voltage to the state of charge SOC, with this relationship represented as $U(\theta)$. Such a state exists when the battery 13 has rested at open circuit, i.e., with no battery current (I) flowing into the battery cells 14 of the battery 13 for a duration sufficient for reaching the equilibrium state. Open-circuit voltage is thus an important indication of the actual energy remaining in the battery 13.

High-frequency and low-frequency voltage losses are then considered as behavior effects once the open-circuit voltage has been determined. A low-frequency loss is due to the hysteresis offset and labeled "$\varsigma$ Hyst($\theta$)" in FIG. 5, with $-1 \leq \varsigma \leq 1$. An ordinary differential equation may be used to determine $\varsigma$, e.g., depending on the sign of the battery current (I), as will be appreciated, with hysteresis modeled for both charging and discharging modes of operation. Hysteresis and the optional porous electrode model 58, the latter of which is described below with reference to FIG. 7, thus collectively capture low-frequency behavior effects of the battery cell 14. High-frequency phenomena, such as are caused by the diffusion of lithium intercalating into solid particles, the diffusion of lithium ions in the electrolyte solution 68 of FIG. 2, double-layer capacitance, etc., are handled separately by the high-frequency empirical model 55.

Ordinarily, an over-potential RC circuit model may be used to roughly characterize high-frequency transient voltage behavior. An RC circuit model is representable as follows:

$$R_o I + v_1 + \ldots + v_n,$$
$$C_i \dot{v}_i = I - \frac{v_i}{R_i}, i = 1, \ldots, n.$$

Here, a high-frequency resistor $R_O$, possibly with non-linear behavior, is in series with multiple resistor ($R_i$)-capacitor ($C_i$) pairs, e.g., $R_1 C_1 \ldots R_N C_N$, to collectively represent additional losses that may further affect the open-circuit voltage. Example approaches for implementing RC pairs in such a manner is disclosed in U.S. patent application Ser. No. 14/171,334, published as US 2015/0219726A1 to LENZ et al. and incorporated by reference in its entirety.

The high-frequency empirical model 55 of FIG. 5 is described in detail with reference to FIG. 6, and may be used in lieu of such RC circuit model-based approaches to provide a set of predefined time constants to adequately cover a full range of interest. As noted above, the sensors 16 of FIG. 1 may periodically provide the actual cell voltage, current, and temperature readings to the controller 50 of FIG. 1. The controller 50 predicts the internal state of the battery cell 14 given the time-history of such measured values, with the high-frequency empirical model 55 using a bank of low-pass filters (LPF) 90, i.e., LPF1, LPF2, . . . LPFN, with fixed time constants spread over a time scale of interest.

The output of each LPF 90 branches to pass through one or more predetermined/preprogrammed basis functions 92, with each basis function 92 then multiplied by a calibrated resistance 94. The calibrated resistances 94 vary with the estimated SOC and T, and thus may be adjusted in real-time when adjusting the empirical model 55. A high-pass filter (HPF) 91 may also be used, with the output of the HPF 91 (i.e., time-lagged cell current (I)) likewise passing through one of the basis functions 92 and multiplied by a corresponding calibrated resistance 94. A summation node 95 then outputs an estimated voltage ($V_{est}$) that accounts for the low-frequency and high-frequency effects.

Thereafter, a closed-loop estimation may be used to compare the estimated voltage ($V_{est}$) to the measured cell voltage ($V_C$) and adjust the internal state accordingly, e.g., using the example Kalman filter of FIG. 4 or a variation thereof such as extended Kalman, unscented Kalman, or another estimation technique, as will be appreciated by those of ordinary skill in the art. For this reason, the term "state" as used herein with respect to the empirical model 55 includes the calibrated resistances applied to the various basis functions 92.

Further with respect to the configuration of the LPFs 90, the outputs of the LPFs 90 may be represented as $u_i$, where $i=1, 2, \ldots, M$. Each LPF 90 has a predetermined bandwidth, with the various bandwidths spread over a range of interest as noted above. One possible embodiment is a $1^{st}$-order lag filter represented as $\tau \dot{u}_i = -u_i + I$. After a calibrated rest period, $u_i$ is initialized, i.e., $u_i = 0$. The various time constants, $\tau_i$, span the range of interest for the battery state estimation, for instance 1-1000 s. For N=4, for instance, one might choose $\tau_1 = 1000$, $\tau_2 = 100$, $\tau_3 = 10$, and $\tau_4 = 1$, with higher time-constants moving slower than lower time constants as will be understood in the art. Time-constants spread in a geometric ratio in this manner help keep parameter identification well-conditioned, with the ratio $$\frac{\tau_k}{\tau_{k+1}} = 10$$

in the above example. Ratios are approximate, and other schemes for spreading out the time constants may be utilized within the scope of the disclosure. Relative to the LPFs 90, the HPF 91 may have a shorter time constant, or merely $u_H = I$, i.e., a straight pass-through of the battery current (I) signal as noted above. In an alternative arrangement, some or all of the low-pass filters could be replaced with band-pass filters, with the cut-off frequencies of these band-pass filters being arranged to collectively cover the entire frequency range of interest.

Figure 6:
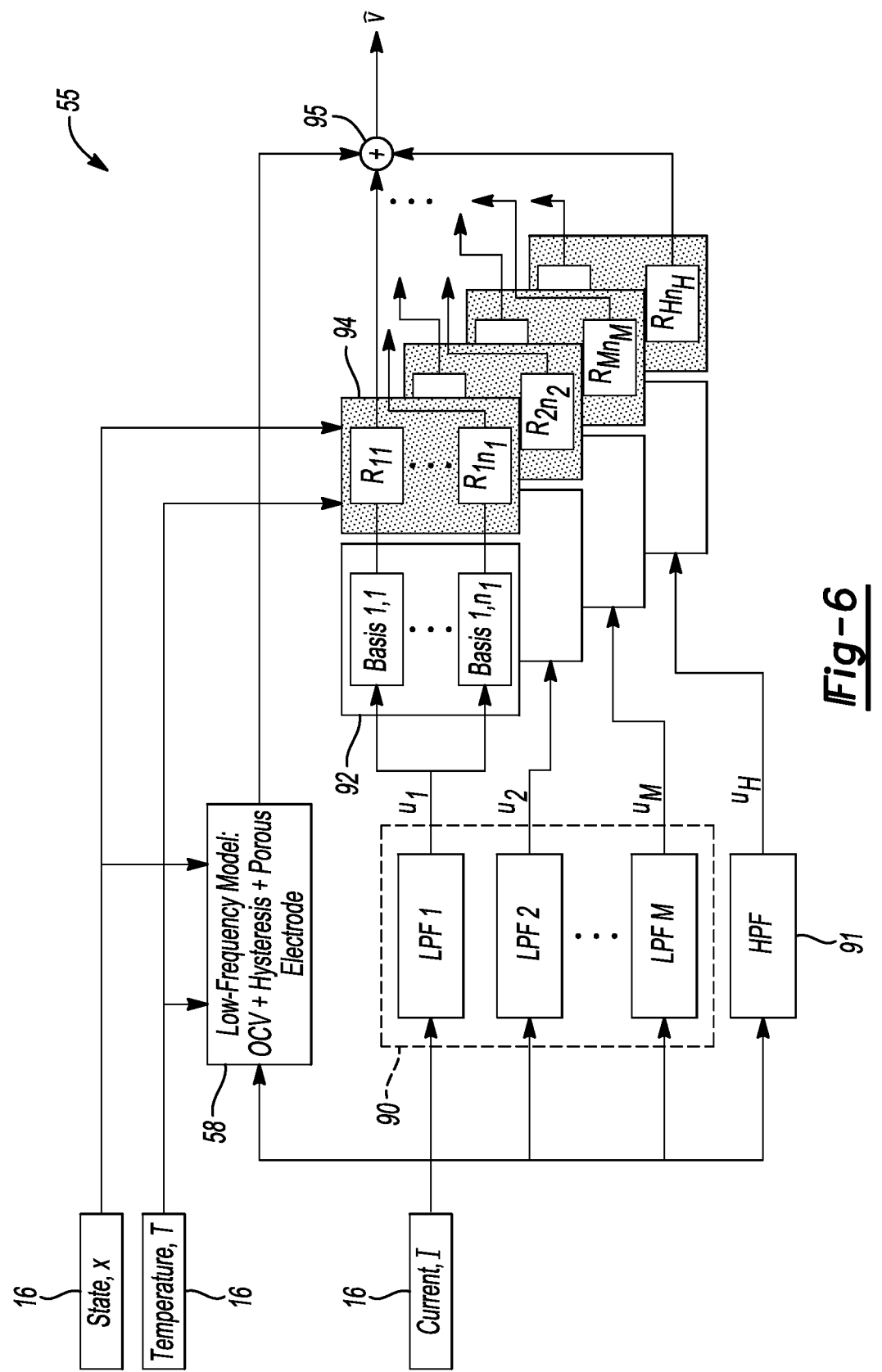
FIG. 6 is a schematic illustration of a combined physico-chemical mode of low-frequency behavior with the empirical model of higher-frequency behavior using a bank of example low-pass and high-pass filters with varied time constants.
Figure 7A:
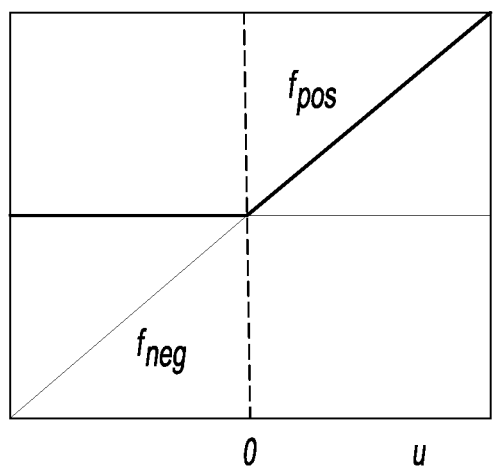
FIGS. 7A and 7B are example depictions of basis functions usable as part of the empirical model of FIG. 6.
Figure 7B:
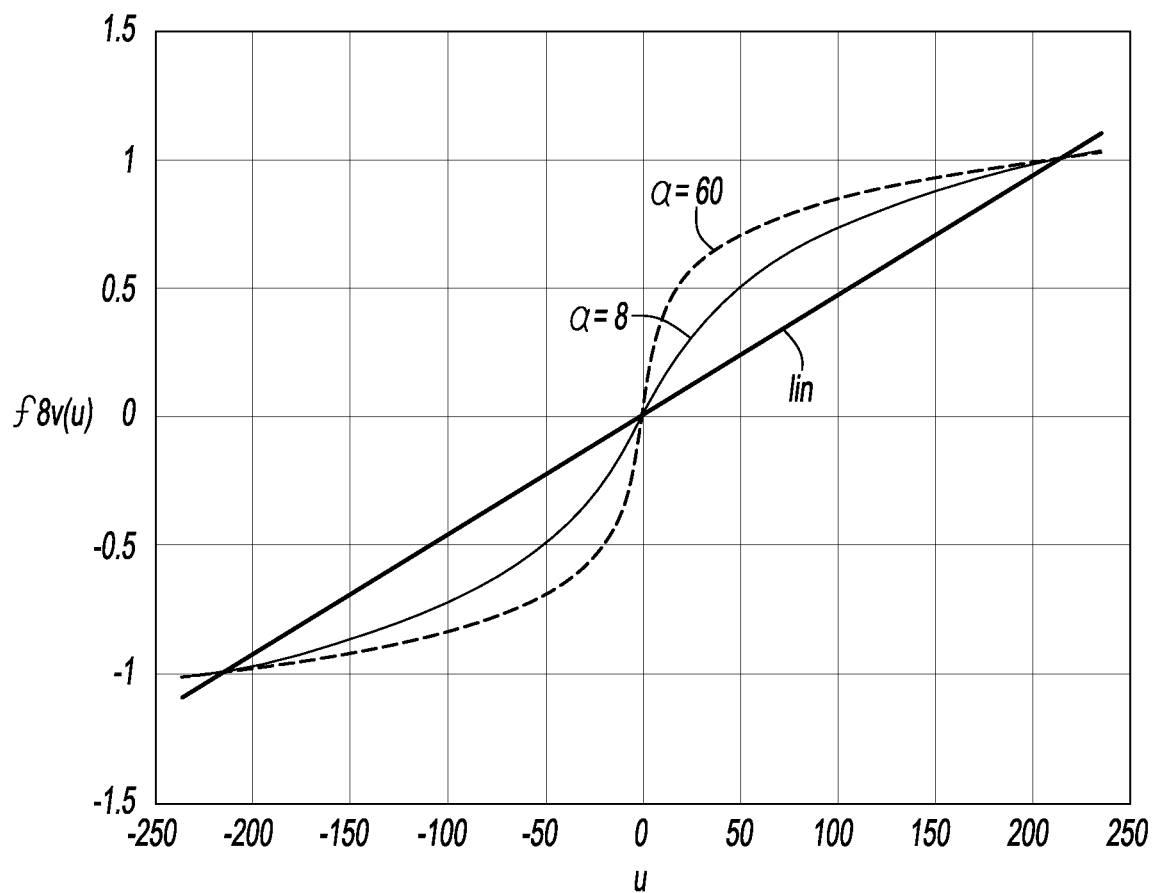

Basis Functions: each time-lagged current $u_i$, and the high-pass current, $u_H$, pass through one or more of the basis functions 92 as shown, labeled "Basis" in FIG. 6, and also representable as $f_{i,j}$. Referring briefly to FIGS. 7A and 7B, a linear basis function ("lin" of FIG. 7B) is represented as $f_{lin}(u_i) = k u_i$. For good scaling, k can be chosen as approximately $$\frac{1}{I_{max}},$$

with $I_{max}$ being the maximum current the battery 13 expects to see, but k=1 may suffice. A non-linear basis function can model the decrease in the effective charge-transfer resistance expected at high current rates due to the Butler-Volmer effect. For a symmetric material, this takes the form of $$f_{BV}(u) = \frac{a \sinh\left[\alpha\left(\frac{u}{I_{max}}\right)\right]}{a \sinh(\alpha)},$$

where $\alpha$ is a constant and where asinh( ) is the inverse hyperbolic sine function. As $\alpha \to 0$, this function approaches a linear one, $$\frac{u}{I_{max}}.$$

A larger of the constant ($\alpha$) is suitable for modeling cold behavior where the Butler-Volmer effect is more pronounced. Alternatively, an S-shaped function produces a similar result and could be used. Examples of $\alpha=60$ and $\alpha=8$ are shown in 7B.

Behaviors dependent on the current direction (charge vs. discharge) may be captured with asymmetric basis functions 92. For example, as shown in FIG. 7A, using these functions allows the resistance for positive current and the resistance for negative current to be different:

$$f_{pos}(u) = \begin{cases} u, & \text{if } u > 0; \\ 0, & \text{else.} \end{cases}$$

$$f_{neg}(u) = \begin{cases} u, & \text{if } u < 0; \\ 0, & \text{else.} \end{cases}$$

The basis functions, $f_{ij}(u_i)$ can be chosen from among these or other suitable functions. Functions that increase monotonically with u may be of particular benefit. Additionally, functions should have $f(0)=0$, because $OCV(\theta)$ shown at 54 in FIG. 5 already models open-circuit behavior.

Calibrated Resistance: referring again to FIG. 6, the calibrated resistances $R_{ij}$ are functions of the SOC and temperature. Therefore, such values may be tuned using laboratory testing and stored in memory (M) of the controller 50, accessible to the BSE logic block 20 of FIG. 3, or such values may be regressed in real-time. In regression, it is advisable to constrain the resistances to be non-negative. Thus, total battery voltage may be expressed as:

$$V = OCV(\theta) + \zeta Hyst(\theta) + V_{porous} + \sum_{i=1,\ldots,N,H} \sum_{j=1}^{n_i} f_{ij}(u_i)R_{ij}(\theta, T)$$

with $n_i$ being the number of basis functions 92 used in the various LPFs 90 of FIG. 6. For regression, it is convenient that each $R_{ij}$ appears linearly in this formula:

$$\frac{\partial V}{\partial R_{ij}} = f_{ij}(u_i).$$

To estimate both the state vector (x) and the resistance ($R_{ij}$), let the augmented state vector include the above-noted values, i.e.:

$$x_{aug} = [\theta, \zeta, \theta_{e1}, \ldots, \theta_{eN}, u_1, \ldots, u_M, R_{11}, \ldots, R_{H_{n_H}}]^T$$

where subscript e may be either "pos" or "neg" depending on whether the PET model is applied to the positive or negative electrode. If a PET model is applied to both electrodes, the augmented state vector becomes:

$$x_{aug} = [\theta, \zeta, \theta_{pos1}, \ldots, \theta_{pos,N_{pos}}, \theta_{neg1}, \ldots, \theta_{neg,N_{neg}}, u_1, \ldots, u_M, R_{11}, \ldots, R_{H_{n_H}}]^T$$

where the number of layers used to model the two electrodes, i.e., $N_{pos}$ and $N_{neg}$ might be different. For resistances, suppose each $R_{ij}$ is tabulated in memory (M) as $R_{ij}^{Tab}(\theta,T)$. Values may be stored for a grid of SOCs and temperatures in a possible embodiment. Since the actual values of a particular battery 13 may differ from the nominal stored values, one can adjust the resistances as part of the present estimation method 100. Also, resistances change as the battery 13 ages. An ordinary differential equation (ODE) for $R_{ij}$ can be taken as either $\dot{R}_{ij}=0$ (i.e., constant resistance), or as $$\dot{R}_{ij} = \left(\frac{\partial}{\partial \theta}R_{ij}^{Tab}\right)\dot{\theta} = \left(\frac{\partial}{\partial \theta}R_{ij}^{Tab}\right)\frac{1}{Cap}I.$$

The second form follows the tabulated function more closely than the constant form. Either ODE may be modified by adding a stochastic process noise term, as in the usual EKF technique, as will be appreciated by those of ordinary skill in the art. At start-up, the resistances may be initialized using their tabulated functions. Then, after assigning measurement noise terms to the voltage, current, and temperature ($V_C$, I, and T) and process noise terms to the state ODEs, the estimation method 100 may follow the standard Extended Kalman Filter (EKF) formulation or related variants such as the Unscented Kalman Filter (UKF).

Low-Frequency Effects: referring again briefly to FIG. 5, the low-frequency effects may be treated herein using the optional porous electrode model 58. As will be appreciated, the front surface of an electrode, i.e., nearest the respective separator layer 78 of FIG. 2 proximate the anode 74 or the cathode 76, responds relatively quickly to an applied current with respect to surfaces or layers located father away. It thus takes longer for lithium to penetrate to the rear surface of the electrode, i.e., the surface nearest a current collector. The porous electrode model 58 or other approaches may be used to better account for the resultant uneven state of charge, and may be applied to either or both electrodes 74 and/or 76 of a given battery cell 14. For the present generation of lithium-ion batteries, it is particularly useful when applied to the negative electrode, i.e., the anode 74, due to the highly nonlinear open-circuit voltage curve response of graphite.

Figure 8:
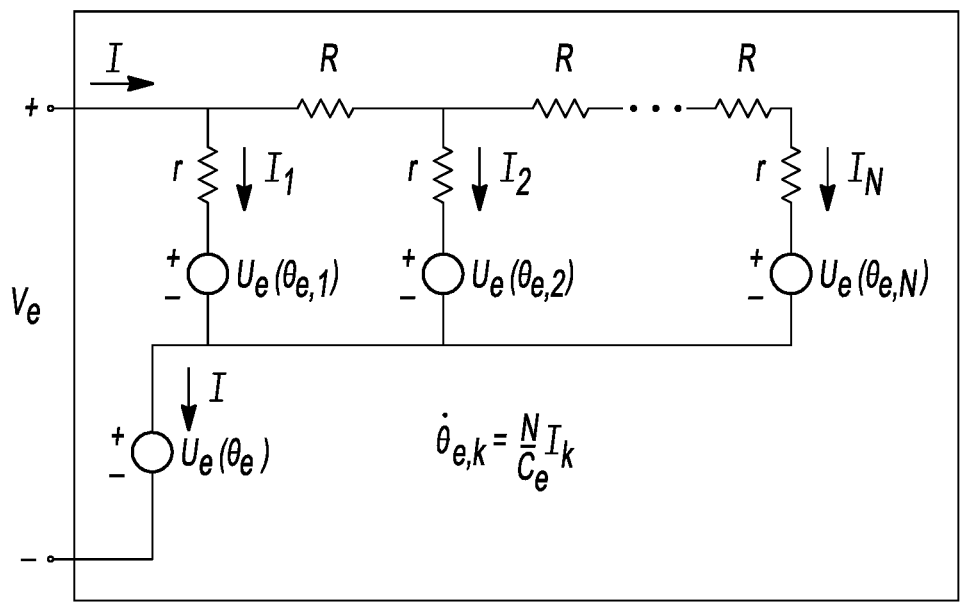
FIG. 8 is an equivalent circuit model usable as an optional part of the circuit shown in FIG. 5 to help model charge transfer through the battery cell(s) and thereby account for low-frequency behavior effects.

The porous electrode model 58 noted above may be embodied as an equivalent circuit, or as system of partial differential equations. An equivalent circuit representation of FIG. 8 is a discretized model of such charge transfer within a given electrode (e), e.g., the anode 74 or cathode 76 of FIG. 2. Full-cell OCV is the sum of the OCVs for both electrodes of a given battery cell 13:

$$U(\theta) = U_{pos}(\theta_{pos}) + U_{neg}(\theta_{neg})$$

$$\theta_e(t) = \theta_e(0) + \frac{1}{C_e}\int_0^t I(\tau)d\tau, \; e \in (pos, neg)$$

Each electrode has its own starting state of charge ($\theta$) and capacity ($C_e$). In bulk, each electrode sees the same battery current as the full battery cell 13. However, at each layer (k) of the electrode, the current (I) splits into two components: an intercalation current that charges the layer, and a pore current that passes lithium through to the next layer.

There is also resistance associated with each component of the battery current (I), i.e., a temperature-dependent charge-transfer resistance (r) describing resistance to a transfer of charge into a particle, as will be appreciated, and a temperature-dependent effective pore resistance (R) that is the resistance to moving lithium ions down pores of the electrode, i.e., a function of the electrolyte material 68, pore size, etc.

Such an equivalent circuit as depicted in FIG. 8, where $V_e$ is the transient voltage. Thus, the equilibrium value $U_e(\theta_e)$ may be subtracted before inserting into the full model of FIG. 3. The number of layers (N) may also be adjusted. More layers result in a closer approximation to a related PDE system, but also require additional computational resources. In an embodiment, $5 \leq N \leq 7$ for optimal performance tradeoff, although more or fewer layers may be used in other implementations.

Given the total current I, the intercalation currents $I_k$, k=1, ..., N can be calculated by solving the tri-diagonal linear system:

$$(r+R)I_1 - rI_2 = U_2 - U_1 + RI,$$

$$-rI_{k-1} + (2r+R)I_k - rI_{k+1} = U_{k-1} - 2U_k + U_{k+1}, \; k=2, \ldots, N-1,$$

$$-rI_{N-1} + (r+R)I_N = U_{N-1} - U_N.$$

The time-derivative of the state of charge of layer k, i.e., $\dot{\theta}_{e,k}$, may be represented as:

$$\dot{\theta}_{e,k} = \frac{N}{C_e} I_k, \; k = 1, \ldots, N$$

where $I_k$ is the intercalation current. With N layers of an electrode (e), then $\theta_{e,1}, \theta_{e,2}, \ldots \theta_{e,N}$ represent the individual states of charge for each of the layers 1, 2, ..., N. Layer 1 in this approach is the layer proximate the separator layer 78 (FIG. 2), and layers 2 through N progressively move away from layer 1 into the depth of the electrode (e).

In another approach, a PDE (partial differential equation) model of the porous electrode (e) may be used. Such a model has a continuous state of charge distribution $\theta_e(t,z)$, where t represents time and z is a non-dimensional depth through the electrode. Thus, z=0 at the current collector of the battery cell 13 and z=1 at the interface between the electrode and the separator layer, e.g., between separator layer 78 and anode 74 of FIG. 2. Likewise, voltage in the electrolyte 68 in the pores of the electrode is denoted V(t,z). The governing PDE system for use in the porous electrode model 58 is, for t>0 and 0≤z≤1:

$$\frac{\partial}{\partial t}\theta_e = \beta(V - U_e(\theta))$$

$$\frac{\partial^2}{\partial z^2} V = \alpha(V - U_e(\theta))$$

$$\left(\frac{\partial}{\partial z} V\right)_{z=0} = 0,$$

$$\left(\frac{\partial}{\partial z} V\right)_{z=1} = \frac{\alpha}{\beta C_e} I$$

where α and β are temperature-dependent parameters. The aforementioned equivalent circuit model is one way to approximate the solution of the PDE system. In particular, if the values (r) and (R) are be derived as:

$$r = \frac{N}{\beta C_e},$$

$$R = \frac{\alpha}{(N-1)\beta C_e},$$

then as N approaches infinity, the equivalent circuit solution approaches the solution of the partial differential equation (PDE). Other methods for discretizing the PDE system for approximating its solution may also be used within the scope of the disclosure and thus used as part of method 100 to perform the low-frequency treatment function during state estimation. Example approaches, as understood in the art, include finite differences, finite elements, and finite volumes. Of these, the finite volume approach may be of particular benefit, as it can be formulated to preserve charge (i.e., preserve the Coulomb count noted above).

As will be appreciated, the present teachings may be advantageously extended to the vehicle 10 of FIG. 1 in executing a corresponding control action. That is, after estimating battery state in terms of state of charge and/or state of power, the controller 50 of FIG. 1 may display the remaining electric range via the range display 25 of FIG. 3, as noted above. Or, the controller 50 may control operation of the battery 13 such as by initiating charging or discharging of the battery 13 based on the estimated battery state.

Optional control actions shown in FIG. 3 also include generation of a numeric state of health (SOH) indicative of the present health or remaining useful life of the battery 13. For instance, when the SOH is indicative of a degraded battery 13, the controller 50 may record a diagnostic code triggering replacement of the battery 13 and/or limiting use of the battery 13 to critical modes, such as a default "limp home" mode providing sufficient propulsion for reaching a suitable maintenance location.

As set forth above, the high-frequency empirical model 55 with its use of LPFs 90, basis functions 92 and resistances 94 as shown in FIG. 6, may be used to account for high-frequency effects in a battery cell 14 of FIGS. 1 and 2. Absent the method 100, one may employ an equivalent circuit model having a high-frequency resistor in series with two or three RC pairs, with such a model having 2n+1 circuit parameters. In the present approach, one may allocate just the linear basis functions 92 to each of M low-pass filters 90 (and/or band-pass filters in some embodiments) and a single high-pass filter 91 such that there are M+1 resistances. By taking M=2n, both models have the same number of parameters to adjust in order to match the linear impedance of the battery 13. Thus, we may expect a roughly equal ability to match the true impedance simply by using M=4 in place of n=2. The high-frequency empirical model 55 easily accommodates non-linearities by including non-linear basis functions 92 in its flow. Regression is also simplified with the model 55, as $V_C$ depends linearly on each $R_{ij}$ even when non-linear basis functions 92 are used, contrary to parameters of an RC pair approach. Thus, model 55 enables improved accuracy estimation via structure that covers a wider frequency range. These and other possible control actions and attendant benefits may be readily appreciated by those of ordinary skill in the art in view of this disclosure.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. An electrical system comprising:
   a battery having one or more battery cells;
   a plurality of sensors configured to output measured signals indicative of an actual state of the battery, the actual state including respective actual voltage, current, and temperature values of each of the battery cells; and
   a controller configured to receive the measured state signals, and responsive to the measured state signals, generate an estimated state of the battery, using at least an open-circuit voltage and an empirical model, the estimated state including a predicted voltage of the battery, and further configured to control an operating state of the electrical system in real-time responsive to the estimated state;

wherein the empirical model includes a plurality of low-pass and/or band-pass filters and a high-pass filter each with a different time-constant collectively spread over a predetermined time-constant range, each of the low-pass and/or band-pass filters branching through one or more basis functions whose outputs are multiplied by a respective calibrated resistance value to generate higher-frequency voltage transients, the controller summing the higher-frequency voltage transients when deriving the predicted voltage.

2. The electrical system of claim 1, wherein the controller is further configured to periodically adjust the empirical model based on a difference between the predicted voltage and the actual voltage, and wherein the operating state is a charging or discharging operation of the battery.

3. The electrical system of claim 2, wherein the controller is configured to derive a state of charge of the battery using the estimated state, and to adjust the empirical model by periodically adjusting the respective calibrated resistances based on the state of charge and temperature.

4. The electrical system of claim 3, wherein the electrical system is in communication with a display device, and the controller is configured to display the state of charge via the display device.

5. The electrical system of claim 1, wherein the controller is further configured to generate the estimated state using a low-frequency porous electrode model in addition to the empirical model, the low-frequency porous electrode model accounting for an uneven state of charge distribution between and within opposing electrodes of each of the battery cells.

6. The electrical system of claim 1, wherein the controller is further configured to derive a numeric state of health of the battery using a time history of the estimated state, and to output a signal indicative of the numeric state of health.

7. The electrical system of claim 1, wherein the predetermined time constant range is 1 second (s) to 1000 s.

8. The electrical system of claim 1, wherein the empirical model uses at least three of the low-pass and/or band-pass filters.

9. The electrical system of claim 1, wherein at least one of the basis functions is a non-linear basis function.

10. The electrical system of claim 1, further comprising: an electric machine coupled to a load, such that in the discharging mode, the electric machine powers the load and in the charging mode, the electric machine extracts power from the load to recharge the battery.

11. The electrical system of claim 10, wherein the load is a set of drive wheels of a motor vehicle.

12. A method for use with an electrical system having a battery with one or more battery cells, the method comprising:

measuring and outputting signals indicative of an actual state of the battery, the state signals including respective actual voltage, current, and temperature signals for each of the one or more battery cells; and responsive to the signals, generating an estimated state of the battery via a controller using at least an open-circuit voltage an empirical model, the estimated state including a predicted voltage of the battery, wherein generating the estimated state includes:

feeding the current signal through a plurality of low-pass and/or band-pass filters and a high-pass filter each having a different time-constant collectively spread over a predetermined time-constant range, each low-pass and/or band-pass filter branching through one or more basis functions;

multiplying the output of each low-pass and/or band-pass filter and the high-pass filter by a respective calibrated resistance value to generate a set of higher-frequency voltage transients; and summing the plurality of higher-frequency voltage transients and the open-circuit voltage to derive a predicted voltage of the battery; and controlling an operating state of the electrical system in real-time via the controller responsive to the predicted voltage.

13. The method of claim 12, further comprising: periodically adjusting the empirical model based on a difference between the predicted voltage and the actual voltage.

14. The method of claim 13, further comprising: periodically adjusting the respective calibrated resistances to adjust the empirical model.

15. The method of claim 12, wherein the operating state is a charging or discharging operation of the battery.

16. The method of claim 12, wherein the electrical system is in communication with a display device, the method further comprising: displaying the state of charge via the display device.

17. The method of claim 13, further comprising:
generating the estimated state using a lower-frequency porous electrode model in addition to the empirical model, the porous electrode model accounting for uneven state of charge distribution between and within opposing electrodes of each of the one or more battery cells.

18. The method of claim 12, the method further comprising: deriving a numeric state of health of the battery via the controller using a time history of the estimated state, and outputting a signal indicative of the numeric state of health.

19. The method of claim 12, wherein at least one of the basis functions is a non-linear basis function.

20. The method of claim 12, further comprising: powering an electric traction motor coupled to a set of road wheels of a motor vehicle in the discharging mode.

* * * * *